United States Patent [19]

La Fiandra

[11] Patent Number: 4,539,695
[45] Date of Patent: Sep. 3, 1985

[54] X-RAY LITHOGRAPHY SYSTEM

[75] Inventor: Carlo La Fiandra, New Canaan, Conn.

[73] Assignee: The Perkin-Elmer Corporation, Norwalk, Conn.

[21] Appl. No.: 568,775

[22] Filed: Jan. 6, 1984

[51] Int. Cl.³ .................... H01J 37/06; B65G 1/06; A61K 27/02

[52] U.S. Cl. ................... 378/34; 378/205; 414/222; 250/491.1

[58] Field of Search ............. 378/34, 205, 35, 68, 378/69; 414/222; 250/491.1

[56] References Cited

U.S. PATENT DOCUMENTS

| | | | |
|---|---|---|---|
| 3,743,842 | 7/1973 | Smith et al. | 378/35 |
| 3,892,973 | 7/1975 | Coquin et al. | 378/35 |
| 3,921,788 | 11/1975 | Roberson, Jr. et al. | 414/222 |
| 4,037,111 | 7/1977 | Coquin et al. | 378/35 |
| 4,085,329 | 4/1978 | McCoy et al. | 378/34 |
| 4,185,202 | 1/1980 | Dean et al. | 378/34 |
| 4,187,431 | 2/1980 | Hundt | 378/34 |
| 4,215,192 | 7/1980 | Buckley . | |
| 4,238,682 | 12/1980 | Vratny | 378/34 |
| 4,301,237 | 11/1981 | Burns | 378/35 |
| 4,335,313 | 1/1982 | Kreuzer et al. | 378/34 |

Primary Examiner—Craig E. Church
Assistant Examiner—Charles F. Wieland
Attorney, Agent, or Firm—Thomas P. Murphy; Edwin T. Grimes; Francis L. Masselle

[57] ABSTRACT

The present invention is directed to X-ray lithographic systems, which are characterized by a plurality of work stations, a cartridge in which a wafer and mask are mounted, apparatus for moving the cartridge between the stations, apparatus for moving the cartridge within each station to a kinematic mount, and said kinematic mounts in all of the stations being substantially identical.

2 Claims, 9 Drawing Figures

X-RAY LITHOGRAPHY SYSTEM

FIELD OF INVENTION

This invention is directed to lithographic systems and, more particularly, to X-ray lithographic systems. X-ray lithographic systems constructed according to the concepts of the present invention are particularly adapted, among other possible uses, for use in replicating integrated circuit patterns.

This application is closely related to U.S. patent application Ser. No. 568,777 entitled "X-ray Anode Assembly", and U.S. patent application Ser. No. 568,776 entitled "A Mask Ring Assembly for X-ray Lithography", and U.S. patent application Ser. No. 568,778 entitled "An X-ray Mask Ring Assembly and Apparatus for Making Same". All of said applications are being filed on even date herewith and are assigned to the same assignee, the disclosure contained in said applications are incorporated herein by reference.

BACKGROUND OF INVENTION

X-ray lithography is a proximity patterning technique. A gold pattern X-ray mask is used to selectively absorb and transmit soft X-rays for exposing a resist-coated wafer held in close proximity to the mask. The X-ray mask itself comprises a thin substrate of BN, SiC, or Ti that is supported by a rigid mounting ring. The gold mask absorber pattern is formed by etching a 7000 angstrum thick, gold film deposited on the substrate or by a special, low-stress, gold plating process.

Soft seven angstrum X-rays are generated by a high-power source, a water-cooled rotating anode and an electron gun located together in a vacuum chamber. X-ray's are generated by focusing the hollow, cone-shaped beam of electrons onto the rotating tungsten surface of the anode. The cylindrical, high powered electron gun allows the X-rays generated in a small diameter spot to pass through it. This diverging cone of X-ray radiation then passes through a thin beryllium vacuum window into a helium filled exposure chamber. The mask and wafer are closely aligned prior to insertion into the exposure chamber, and maintained during exposure.

While, such X-ray lithography systems heretofore proposed meet with reasonable success, the present invention is directed to improvements in such systems particularly with respect to producing a high throughput of exposed wafers with a minimum of misregistration between the mask and the wafer, as will become apparent as the description proceeds.

Related patents in this field include, inter alia; U.S. Pat. No. 3,743,842 issued July 3, 1973; U.S. Pat. No. 3,892,973 issued July 1, 1975; U.S. Pat. No. 4,037,111 issued July 19, 1977; U.S. Pat. No. 4,085,329 issued Apr. 18, 1978; U.S. Pat. No. 4,185,202 issued Jan. 22, 1980; U.S. Pat. No. 4,187,431 issued Feb. 5, 1980; U.S. Pat. No. 4,215,192 issued July 29, 1980; U.S. Pat. No. 4,238,682 issued Dec. 9, 1980; U.S. Pat. No. 4,301,237 issued Nov. 17, 1981 and U.S. Pat. No. 4,335,313 issued Jan. 15, 1982.

SUMMARY OF THE INVENTION

Briefly, this application is directed to a new and improved X-ray lithographic system which is characterized by a plurality of work stations, a cartridge, and means for mounting a wafer and a mask on the cartridge. In addition, the system includes means for moving the cartridge between the work stations, means in each of the stations for moving the cartridge to a kinematic mount, and said kinematic mount in all of said stations being substantially identical.

There has thus been outlined rather broadly the more important features of the invention in order that the detailed description thereof that follows may be better understood, and in order that the present contribution to the art may be better appreciated. There are, of course, additional features of the invention which will be described hereinafter which will form the subject of claims appended hereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention.

Several embodiments of the invention have been chosen for purposes of illustration and description, and are shown in the accompanying drawings, forming a part of the specification.

DETAILED DESCRIPTION OF THE PRESENTLY PREFERRED EMBODIMENTS

The X-ray lithographic system comprises an X-ray source, a helium exposure chamber, an alignment cartridge and off-site alignment means. A wafer is aligned to the mask using the alignment cartridge, air gauges, lasers and physical optics alignment sensors, as will be discussed more fully hereinafter.

Figure 1A:
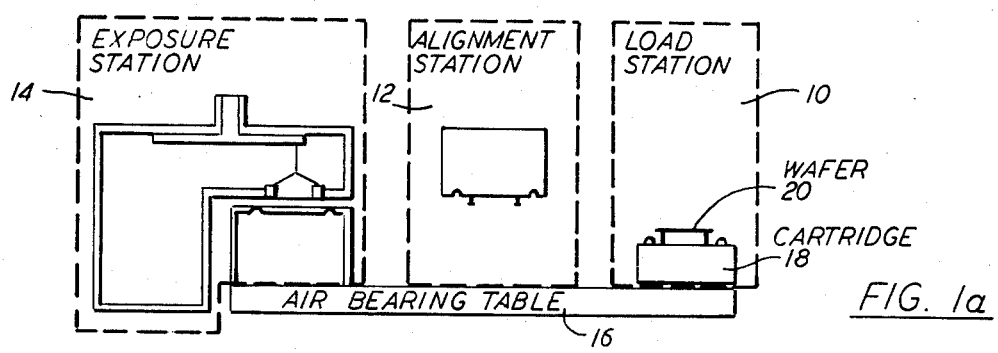
FIGS. 1a to 1e are side elevations of the stations employed, illustrating the steps involved in an X-ray lithographic system according to the invention.

FIGS. 1a to 1e depict the steps of the alignment and exposure sequence, according to one aspect of the invention. The system includes a load station 10, an alignment station 12, and an exposure station 14. A table 16 serves to carry a cartridge assembly 18 on its air bearing pads or feet from one station to the next. The cartridge could be mechanized for movement between work stations, if desired. FIG. 1a shows a wafer 20 manually or if necessary, automatically loaded onto a vacuum waferchuck. The wafer is registered against edge stops in the alignment cartridge 18.

Figure 1B:
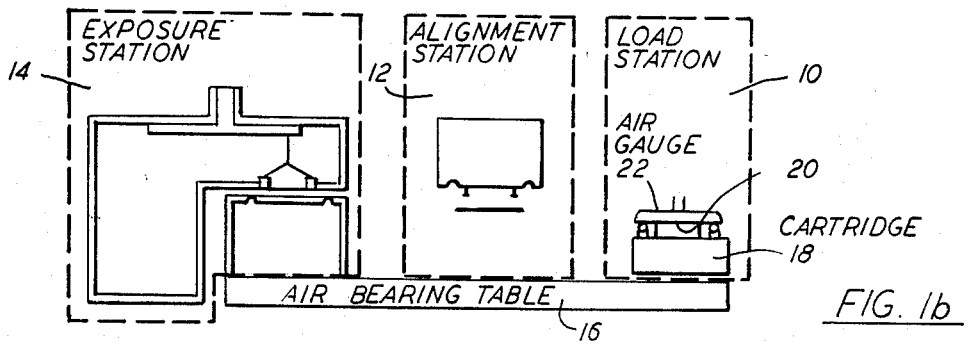

FIG. 1b shows the wafer height being adjusted relative to an air gauge reference 22 to indirectly set the proximity gap and its tilt in two directions between the wafer and the mask position.

Figure 1C:
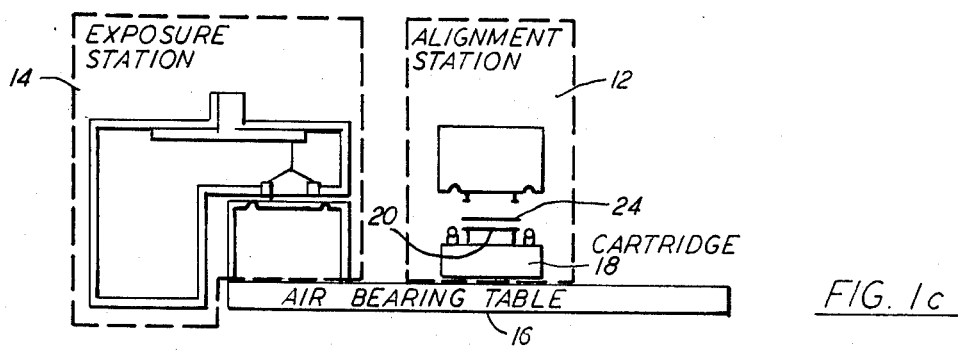

Thereafter, as dipicted in FIG. 1c, a mask 24 is registered over the wafer, on the same seat the air gauge was sitting on, in the alignment cartridge 18 and the cartridge is moved underneath the aligner and elevated in the alignment station 12. Alternatively, the mask could be held under the aligner and automatically picked up when the cartridge comes to this position.

Figure 1D:
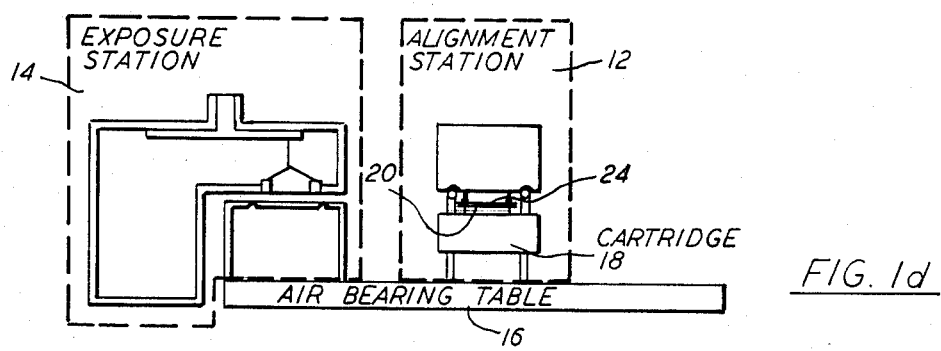

In the alignment station 12, as demonstrated in FIG. 1d, the lateral alignment in the X and Y directions and the rotation about the vertical axis are performed by manually adjusting the position of the wafer in the alignment cartridge with the aid of physical optics alignment signals. If there is an additional magnification error, which means the mask has expanded on contracted, this can be corrected by moving the wafer in the vertical direction. Because the X-ray source is divergent, magnification can be matched by moving the wafer vertically with respect to the mask.

Figure 1E:
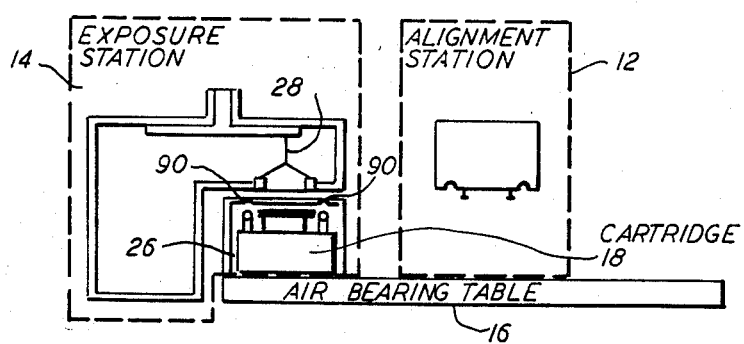

Then, the wafer and its cartridge are lowered and moved on its air bearing pads or feet through a doorway to a helium chamber 26 in the exposure station 14 under an X-ray source 28, as revealed in FIG. 1e. After exposure, the door is opened and the cartridge is moved on its air feet from the exposure station 14 back to the alignment station 12 where the mask is removed. Then the cartridge is returned to the load-unload station 10 where the exposed wafer is removed from the cartridge, and the procedure is repeated.

Figure 2:
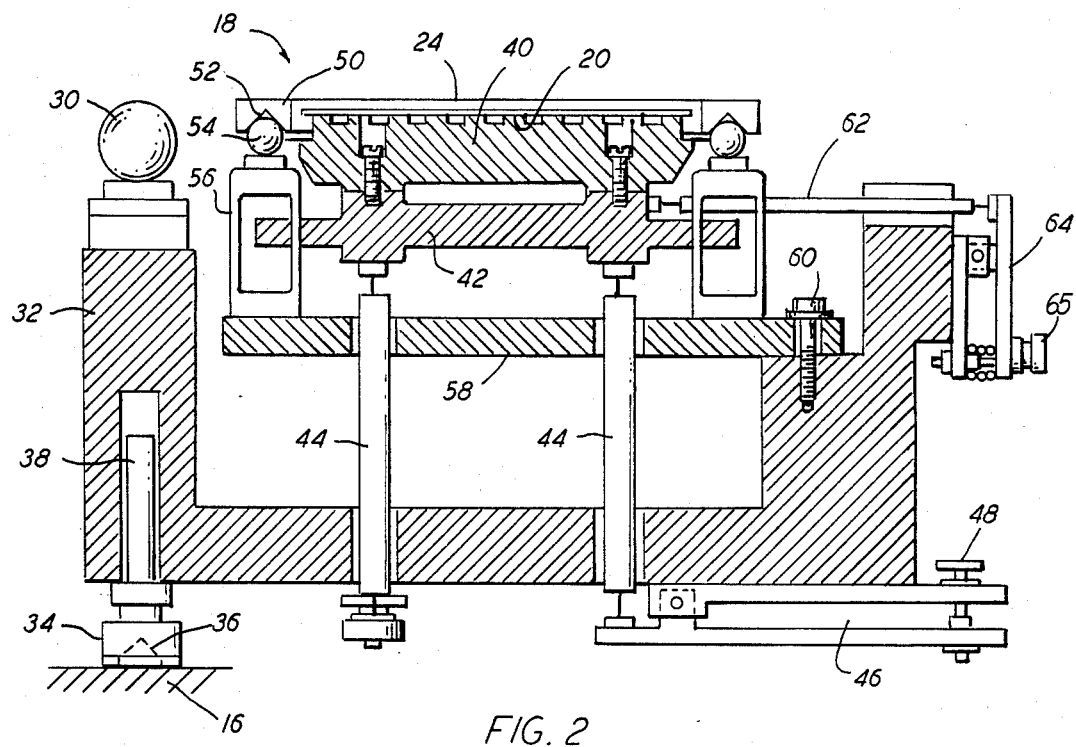
FIG. 2 is an enlarged vertical sectional view of a cartridge used for carrying the mask and wafer in the lithographic system of FIG. 1.

Now considering the foregoing system in more detail, reference is made to FIG. 2 which is directed to the mask-wafer cartridge indicated generally at 18. A feature of this invention is the use of two surfaces of the mask-wafer cartridge assembly, the bottom for transportation from station to station and the top for kinematic registration at each station. For purposes of kinematic registration at each station a ball and v-block or groove interface is employed. While the v-blocks could be carried by the cartridge and the balls mounted in each station, FIGS. 1-4 illustrate the balls mounted on the cartridge and the v-blocks mounted in each station. Referring to FIG. 2 a ball 30 is mounted on the cartridge body 32. The cartridge uses three locating balls, but only one is shown in FIG. 2. The cartridge moves from station to station on a table as illustrated in FIG. 1. The cartridge is provided with an air bearing foot or pad as indicated at 34 in FIG. 2. At each station, ie. load-unload station 10, alignment station 12 and exposure station 14, FIG. 1, the cartridge enters at a lower level and is then moved upwardly until the balls engage their respective v-blocks. For the purpose of producing this upward movement, an air piston is employed. In some installations the air piston is mounted on the air bearing table and when extended engages a cone 36 in the cartridge. A ball is carried at the end of the piston for this purpose. However, it is presently preferred to mount the piston on the cartridge as indicated at 38. When the pistons are extended against the air bearing table the cartridge is lifted. In this case only three piston assemblies are needed and the same pistons are utilized in each of the stations. Also, the necessity of a ball and cone in the feet is eliminated. The air supplied to each piston is individually controlled so as to vary the pressure as a function of the load that each piston carries. Thus, the air pressure directed to each piston is varied to compensate for installations where the center of gravity is not directly between all three points. It will be appreciated that the same force is applied at all three stations in a very repeatable manner.

Still referring to FIG. 2, the wafer 20 is carried by the cartridge assembly by means of an air chuck 40. The chuck is replaceable depending on the size of wafer being handled. A chuck sub-plate 42, attached to the chuck 40 is permanently connected to the cartridge body 32 by means of three certical flexures 44 and three horizontal flexures 62. The cartridge assembly further incorporates a lever reduction mechanism 46 interconnecting the vertical flexure 44 and the cartridge body 32, which is adjustable by a knob 48 to change the position of the wafer with respect to the cartridge and hence with respect to the mask position in the cartridge. This adjustment is made when the cartridge assembly is in the load-unload 10 in cooperation with the measurements of the air gauge 22, FIG. 1b. Adjustment is made with respect to the vertical degree of freedom which has vertical translation, gap setting, and the tilt of the wafer in two directions. That is, by moving one of the vertical flexures you get tilt in one direction and by moving the other you get tilt in a second direction and by moving all three together you get translation, gap sitting. This will be explained more fully hereinafter in connection with the discussion of FIG. 3.

The mask 24 is carried by a mask ring 50, which is provided with a conically-shaped groove 52 for receiving a ball 54. Ball 54 is carried by radially compliant flexures 56, which are connected to a flexure 58, that in turn is connected to the cartridge body 32 by a course adjustment screw 60. There are a total of three conically shaped grooves, three balls, three radial flexures, one flexure plate and three adjustment screws utilized in the system. It is noted that the X-ray pattern on the mask can be very accurately generated, but the position of that accurately generated pattern can not be put down to high accuracies. So as not to run out of adjustment range in the system, the mask ring is coursely aligned, by having its seating position accomodate course alignment. To do this a mask ring is placed on the balls 54, the adjusting screws 60 are loosened and with a microscope fixture or equivalent the flexure plate 58 is moved until the mask ring is in the captive range of the alignment system. Then the adjustment screws are tightened and the mask is in effect fixedly positioned with respect to the cartridge body. Further adjustment is made by moving the wafer.

The chuck sub-plate 42 is also attached to the cartridge body 32 by means of horizontal flexures 62, three being provided. The assembly incorporates a lever reduction mechanism 64 interconnecting the horizontal flexure 62 and the cartridge body 32, which is adjustable by knob 65 to change the position of the wafer with respect to the cartridge, and hence, with respect to the mask. This alignment is made in the alignment station 12 with the aid of physical optical alignment signals, as will be discussed more fully hereinafter.

Figure 2A:
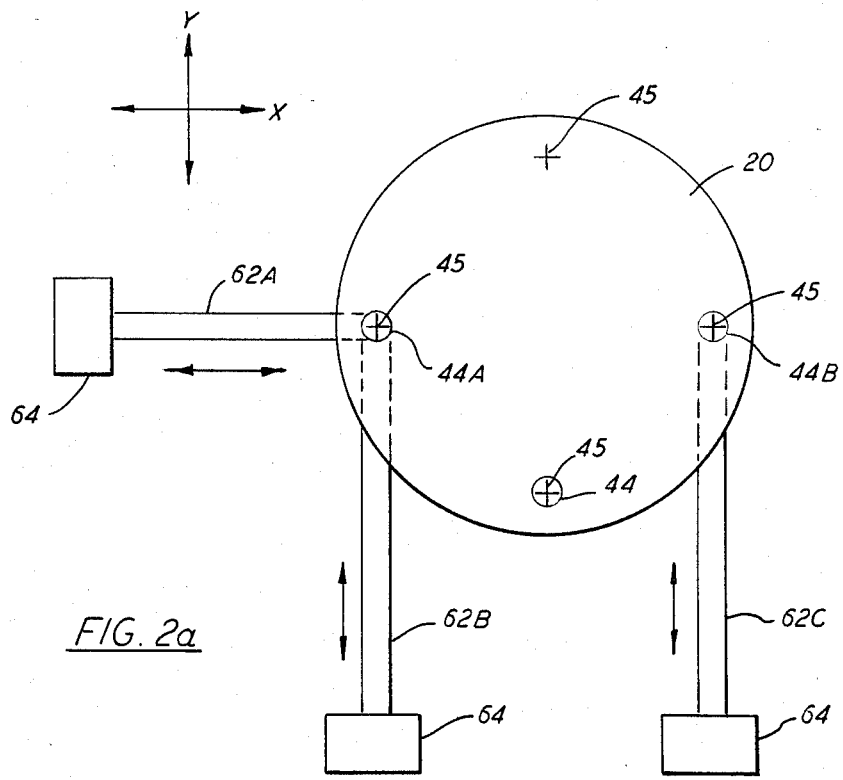
FIG. 2a is a schematic representation of the positional relationship between the horizontal and vertical flexures.

The flexures 44 and 62 have a unique positional relationship, as illustrated in FIG. 2a. The three vertical flexures 44, 44A and 44B are coaxially disposed with respect to three of the four alignment marks 45 projected from the mask onto the wafer 20. The three horizontal flexures 62A, 62B and 62C function as depicted in the following Table I:

TABLE I

| MOVE FLEXURE NUMBER | ROTATION POINT | RESULTANT MOTION |
| --- | --- | --- |
| 62B | 44B | "Y" Motion At Point 44A |
| 62A | Infinity (Flexures are parallel) | "X" Motion At Point 44A |
| 62C | 44A | "Y" Motion At Point 44B |

In operation, the motion of the flexures 62A, 62B or 62C results in rotation about the point defined by the intersection of the lines of action of the two unmoved flexures. In essence one alignment mark is moved in "X" and "Y" to the point 44A, and then held there while the other mask is moved in "Y" until it is over 44B.

It is noted that fine motion devices, eg. piezo electric type, could be inserted in series with the flexure rods for closed loop servo or so-called "hands-off" operation.

Figure 3:
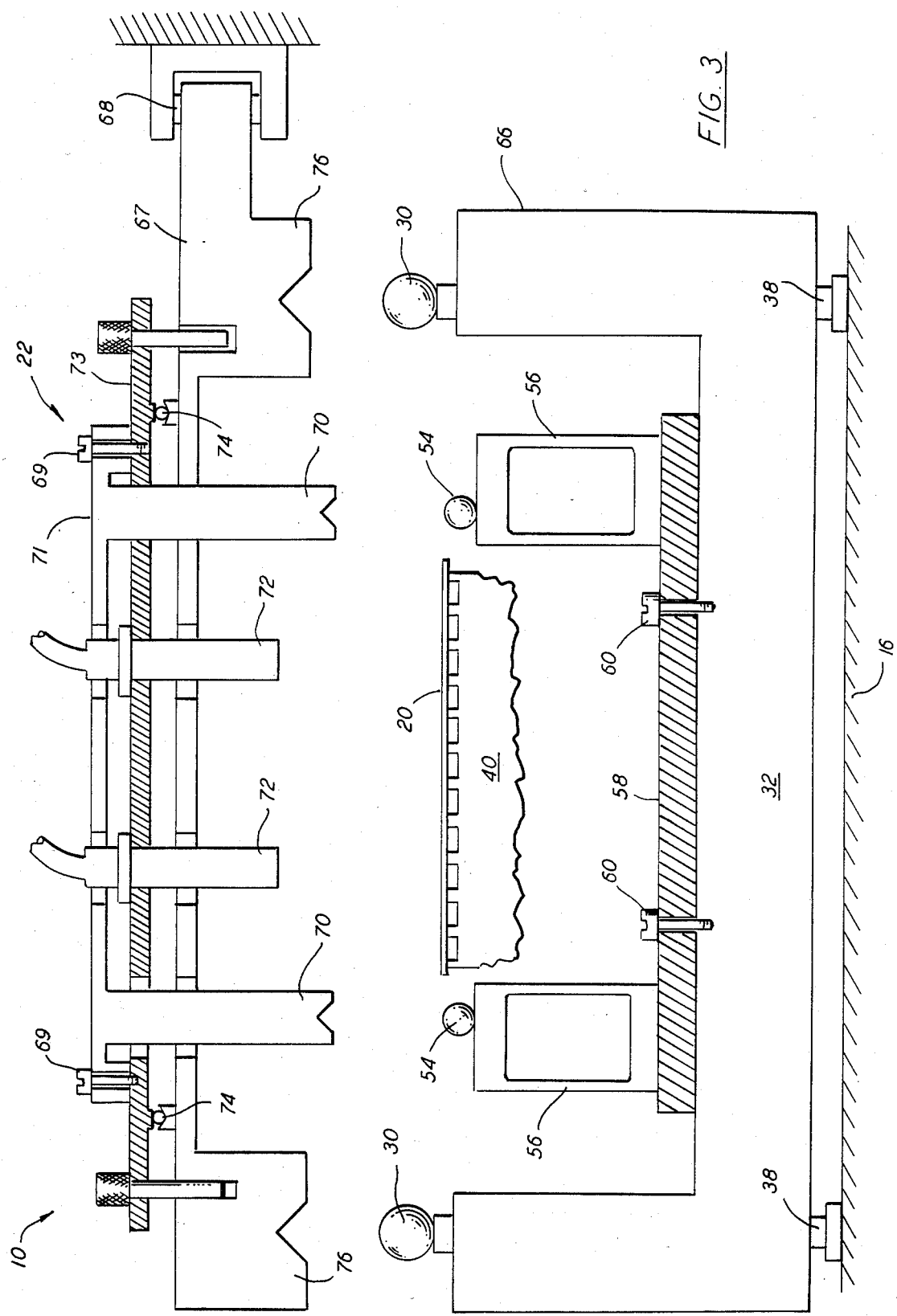
FIG. 3 is an enlarged side elevation, partly in section, depicting the load-unload/gap gauging system station of the lithographic system.

FIG. 3 shows in more detail features of the load-unload/gap gauging station 10. The upper portion of the cartridge assembly is indicated at 66. This includes the balls 30 mounted on the cartridge body 32. Also shown is the flexure plate 58, adjustment screws 60 and radial flexures 56 carrying the balls 54. At this point nothing is mounted on the balls 54. Later in the operation the mask ring will be mounted thereon. In the load station wafer 20 is manually mounted on the air chuck 40. An air gauge arm assembly indicated at 22, having an arm member 67, is mounted as at 68 for pivotal movement in and out of a position directly over the cartridge assembly. In its operative position it is directly over the cartridge. Initializing pins 69 serve to adjust an upper support member 71 with respect to a lower support member 73. At this point in time the cartridge is moved upwardly by means of the air pistons 38 until the balls 54 engage the v-blocks or air gauge mounts 70 carried by the upper support member 71. Continued upward movement of the cartridge lifts the lower support member 73 with the air gauges 72 off their mounts 74 on the arm member 67. The cartridge continues to move upwardly until the balls 30 bottom out in the v-blocks 76. At this point of time the air gauges are sitting by their own weight on the balls 54 exactly where the mask will sit later in the operation. By use of the air gauges in a conventional manner, the wafer 20 is adjusted by manipulation of the vertical flexures 44, FIG. 2, with the knob 48. Adjustment is made with respect to the tilt of the wafer in two directions, as well as translation or vertical positioning thereof. After adjusting the wafer the cartridge is lowered. On its way down, the balls 30 leave the v-blocks 76 first and then a little way further down the v-grooves of the air gauge mounts 70 leave the balls 54. Subsequently thereto, the cartridge is lowered to its lower or travel position and the air gauge arm assembly 22 is swung about its pivot 68 to its out of the way position. Then the cartridge is moved by its air feet or pads 34, FIG. 2., to the alignment station 12, FIG. 1.

Figure 4:
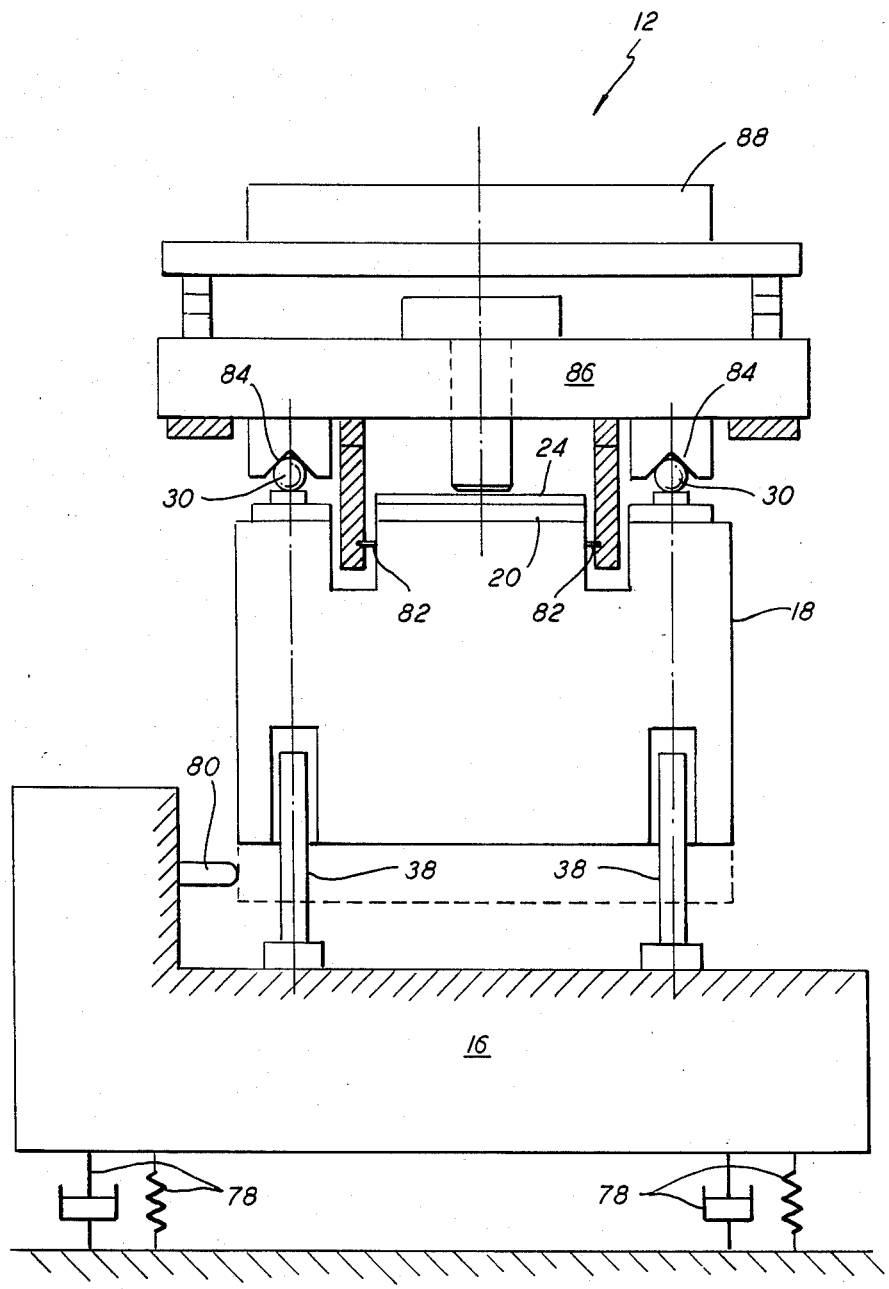
FIG. 4 is an enlarged side elevation depicting the alignment station of the system.

FIG. 4 illustrates the alignment station indicated generally at 12, in more detail. The air bearing table is indicated at 16. It has vibration isolation feet 78 so that the table is free from outside world vibrations. Stops 80 serves to initially locate the cartridge 18 in the down position in the alignment station. After arriving in the station from the load-unload station 10 the cartridge is moved upwardly by means of the air pistons 38. At this time the mask 24, on its support ring, is supported in the alignment station by retractable radially extending support pins 82. During the cartridge's upward travel it picks up the mask and support ring, and the balls 54 enter the conical grooves 52 of the support ring 50, FIG. 2. The support pins 82 are then retracted. The cartridge continues on its upward travel until the balls 30 bottom out in v-blocks 84. The v-blocks 84 are mounted on an optical bench 86 which carries a distribution optics system indicated generally at 88. It will be appreciated that the cartridge itself is referenced to the alignment system so that when the cartridge comes up to the sensors that are used in the alignment system during the final alignment, it is within accepted range of the final alignment system. Any suitable alignment system may be employed such as, for example, a microscope or a physical optics aligner. The wafer is adjusted by manipulation of the horizontal flexures 62, with knob 65, FIG. 2. Adjustment is made with respect to the lateral X and Y directions as well as rotation about a vertical axis. The physical optics aligner uses four physical optics sensors. This technique consists of measuring the relative positions of linear zone-plate patterns on the mask to line diffraction gratings on the wafer. The one-dimensional lens-like property of the zone plate focuses incident laser radiation into a line focus at the surface of the wafer. When this line focus coincides with a narrow grating etched in the wafer, laser energy is diffracted into position and negative orders around the normal to the surface. The majority of the diffracted laser energy falls into the plus or minus first diffraction orders and is collected and then sensed by a photodetector. Alignment is achieved when the line grating on the wafer is located precisely under the center of the zone plate pattern on the mask. At this position, a maximum amount of light is diffracted from the grating and sensed by the photodetector.

Compensation for linear wafer or mask expansion is accomplished with a fourth alignment mark and physical optics alignment sensor. The width between two alignment marks is measured and compared with their nominal value. Any error in magnification is compensated for by a small resetting of the proximity gap prior to exposure.

Alignment control signals are generated by angularly scanning the laser beam over small angles to cause the laser line focus to scan sinusoidally over the grating. The output of the photodetector is sent to a phase sensitive amplifier. The zero crossing of the differentiated output of this amplifier is used as a indication of fine alignment.

The cartridge carrying the mask and wafer is then moved to its lower or travel position, and carried by its air feet or pads along the air bearing table 16 to the helium chamber 26 in the exposure station 14, FIG. 1e. In the exposure station the cartridge is again moved upwardly until the balls 30 move into engagement with v-blocks 90, thereby assuring alignment and the same resultant deformations. At this time the wafer is exposed by the X-rays 28.

After exposure the cartridge carrying the mask and wafer is returned to the alignment station 12 where it is again moved upwardly until the mask and mask ring are above the location of the support pins 82. The pins are then extend radially inwardly and the cartridge is lowered leaving the mask and support ring resting on the support pins. The cartridge is then moved via its air feet back to the load-unload station 10, where the wafer is manually unloaded.

It will thus be seen that an important aspect of the invention is the specific design of the cartridge and how it interfaces with the system. In summary, the cartridge holds the X-ray mask and wafer and is adapted to travel on air bearings for transportation between stations. When located in any one of the stations, it is moved upwardly into a kinematic mount i.e. three sets of balls and mating radial v-blocks. The v-blocks 76, 84 and 90 at each station are all substantially identical and, as a result, the cartridge takes the same mechanical deformation at each station. The same pistons are used at each station for raising the cartridge, thereby providing a repeatable controlled force between the v-blocks and balls. At each station, in the upper position, all critical components are integrally tied together, ie. the mask, wafer, the kinematic mount, mask-wafer alignment system and the exposure system, thereby reducing motion between them as a function of outside disturbances. It will be appreciated that thermal considerations are also of importance. The system of the invention is so constructed and arranged that the critical elements thereof are in close proximity with respect to each other. That is, the mask, wafer, locating balls and v-blocks, and the alignment optics are all in intimate contact or closely associated with each other. As a result they are affected in the same way and tend to react in the same manner to outside world thermal changes. This minimizes the effects of stresses and their resultant strains caused by mechanical and thermal disturbances for both long and short terms.

Although specific embodiments have been illustrated and described, it will be obvious to those skilled in the art that various modifications may be made without departing from the spirit and scope of the invention, which is to be limited solely by the appended claims.

What is claimed is:

1. A method of treating a mask and wafer in an X-ray lithographic system comprising the steps of:
    mounting a wafer on a cartridge at a load station;
    moving said cartridge upwardly to a kinematic mount in said load station;
    adjusting in co-operation with an air gauge in said load station the tilt in two directions of said wafer and its proximity with respect to a mask position in said cartridge;
    lowering said cartridge to its travel position;
    moving said cartridge on its air feet to an alignment station;
    mounting a mask on said cartridge; moving said cartridge upwardly to a kinematic mount in said alignment station;
    adjusting the lateral alignment in the X and Y direction and the rotational alignment about a vertical axis of said wafer with respect to said mask;
    lowering said cartridge to its traveling position with the mask retained;
    moving said cartridge on its air feet to an X-ray exposure station;
    moving said cartridge upwardly to a kinematic mount in said exposure station;
    purging the area with helium gas; and
    exposing said wafer with X-rays.

2. A method according to claim 1 further comprising the steps of:
    in said exposure station lowering said cartridge to its travel position;
    moving said cartridge on its air feet to said alignment station;
    removing said mask from said cartridge; and
    moving said cartridge on its air feet to said load station.

* * * * *